US009287165B2

(12) United States Patent
Schmidt et al.

(10) Patent No.: US 9,287,165 B2
(45) Date of Patent: Mar. 15, 2016

(54) SEMICONDUCTOR DEVICE AND METHOD FOR PRODUCING THE SAME

(71) Applicant: Infineon Technologies AG, Neubiberg (DE)

(72) Inventors: Gerhard Schmidt, Wernberg (AT); Matthias Müller, Regensburg (DE); Francisco Javier Santos Rodriguez, Villach (AT); Daniel Schlögl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 13/927,923

(22) Filed: Jun. 26, 2013

(65) Prior Publication Data

US 2015/0001719 A1    Jan. 1, 2015

(51) Int. Cl.
*H01L 21/76* (2006.01)
*H01L 21/768* (2006.01)
*H01L 29/06* (2006.01)

(52) U.S. Cl.
CPC ...... *H01L 21/76841* (2013.01); *H01L 29/0615* (2013.01); *H01L 29/0619* (2013.01)

(58) Field of Classification Search
CPC ............... H01L 21/76843; H01L 23/53238; H01L 21/76846; H01L 23/53223; H01L 21/76877; H01L 21/76856; H01L 21/76855
USPC ................. 257/751; 438/627, 643, 653, 927
See application file for complete search history.

(56) References Cited

U.S. PATENT DOCUMENTS

| 2006/0065891 A1* | 3/2006 | McCormack ......... H01L 29/417 257/50 |
| 2010/0044825 A1* | 2/2010 | Schmidt ............... H01L 21/266 257/493 |

(Continued)

FOREIGN PATENT DOCUMENTS

DE    10358985 B3    5/2005

OTHER PUBLICATIONS

Chang, et al. "Amorphouslike chemical vapor deposited tungsten diffusion barrier for copper metallization and effects of nitrogen addition." Journal of Applied Physics 82. AIP, 1997. pp. 1469-1475.

(Continued)

*Primary Examiner* — Allen Parker
*Assistant Examiner* — Didarul Mazumder
(74) *Attorney, Agent, or Firm* — Murphy, Bilak & Homiller, PLLC

(57) ABSTRACT

A power semiconductor device includes a semiconductor body, having an active zone and a high voltage peripheral zone laterally adjacent to each other, the high voltage peripheral zone laterally surrounding the active zone. The device further includes a metallization layer on a front surface of the semiconductor body and connected to the active zone, a first barrier layer, comprising a high-melting metal or a high-melting alloy, between the active zone and the metallization layer, and a second barrier layer covering at least a part of the peripheral zone, the second barrier layer comprising an amorphous semi-isolating material. The first barrier layer and the second barrier layer partially overlap and form an overlap zone. The overlap zone extends over an entire circumference of the active zone. A method for producing such a power semiconductor device is also provided.

25 Claims, 6 Drawing Sheets

(56) References Cited

U.S. PATENT DOCUMENTS

| | | | |
|---|---|---|---|
| 2010/0320536 A1* | 12/2010 | Schmidt | H01L 29/802 257/337 |
| 2011/0186962 A1* | 8/2011 | Moriyama | H01L 24/03 257/529 |
| 2012/0104537 A1* | 5/2012 | Schmidt | H01L 29/0638 257/476 |

OTHER PUBLICATIONS

Appels, et al. "Thin Layer High-Voltage Devices (Resurf Devices)." Philips Journal of Research, vol. 35. Philips, 1980. pp. 1-13.

Baliga, B. Jayant. "Fundamentals of Power Semiconductor Devices." Springer, 2008. pp. 106-163.

\* cited by examiner

SEMICONDUCTOR DEVICE AND METHOD FOR PRODUCING THE SAME

TECHNICAL FIELD

This specification refers to embodiments of methods for forming a semiconductor device. Furthermore, this specification refers to embodiments of semiconductor devices, for example IGBTs, DMOS, bipolar transistors, IGBTs, Diodes, or thyristors with an improved barrier layer between the semiconductor area and a metallization layer.

BACKGROUND

For improving the stability in case of short circuit and for increasing the load change performance of, e.g., IGBTs, there has been a tendency to replace the well-known metallization using aluminum (AlSi or AlSiCu) with a thick Cu metallization in the regime of 5 μm to 20 μm. This shall provide a higher performance of IGBT modules, enabling higher operating temperatures and a higher resistivity with respect to switching losses due to enhanced heat dissipation.

However, the application of Cu as a metallization bears some drawbacks. For example, Cu reacts with Si at temperatures as low as room temperature and results in Cu silicides. As an example, $Cu_3Si$ forms at room temperature. Hence, a barrier between the Cu metallization and the Si is required. Typically, a barrier layer of a material with a high melting point is provided, such as W, Ta, Ti, Mo, or an alloy of these elements with other elements, such as TiW or TiN. Frequently, combinations of various layers employing different elements are used.

Furthermore, Cu atoms tend to diffuse into Si and can thus drastically reduce the life time of minority charge carriers. This may lead to various drawbacks, for example an undesirable enhancement of the forward voltage and the leaking current in a blocking state.

Furthermore, in a humid atmosphere, an electrochemical reaction in the presence of a voltage difference can lead to a discharge of Cu ions. These are produced by anodic oxidation, may start wandering due to the presence of the electrical field during operation and may under certain circumstances accumulate at the cathode, whereby Cu dendrites are formed, which is also known as electro migration. The latter process occurs primarily in the region of the edge termination, because in this region a higher electric field is present. During the drift process towards the edge region, the positively charged Cu ions may disturb the well-defined change of potential.

Due to the required thorough isolation in the region of the edge termination, a TiW barrier as described above cannot be applied as a continuous protection in that region, because it would shortcut the device. Therefore, in the edge termination region, typically materials like $SiO_2$ or $Si_3N_4$ are applied. The introduction of a barrier layer of a material like TiW for inhibiting an interaction between the Cu of a metallization layer and the Si of a semiconductor layer is for example known from K.-M. Chang et al., Journal of Applied Physics 82, 1469-1475 (1997).

Additionally, elements like field-ring or field-plate assemblies are applied in the edge termination region, for example comprising $SiO_2$ or Polysilicon, which are also frequently combined in high voltage applications. An example of such a known field-plate field-ring assembly is shown in FIG. 1, having metallic field-plates 10 and doped field-rings 20 in the semiconductor structure. In the areas between metallic field-plates 10, the field lines typically leave the semiconductor structure, thus these regions have to be kept free of metal, with the result that the silicon oxide layers 15 are not protected in these regions. In the prior art, the metallization, including active electrode 26 and field-plates 10 is typically carried out using AlSiCu, having a Cu percentage of about 0.5% to 1.0%, whereby there is no reaction of the low Cu amount with the Si of the silicon. However, when replacing the AlSiCu with Cu, the above described degradation mechanisms can occur. In that case, the intermediate areas between field-plates 10 are potential soft spots with respect to the risk of intruding Cu ions, for example stemming from the field-plates 10, while a border region between well 20 and active electrode 26 is prone to the same problems.

For these and other reasons there is a need for the present invention.

SUMMARY

In a first embodiment, a power semiconductor device is provided. The semiconductor device includes a semiconductor body, having an active zone and a peripheral zone laterally adjacent to each other, the peripheral zone laterally surrounding the active zone. The semiconductor device further includes a metallization layer on a front surface of the semiconductor body and connected to the active zone, a first barrier layer, comprising a high-melting metal or a high-melting alloy, between the active zone and the metallization layer, and a second barrier layer covering at least a part of the peripheral zone. The second barrier layer comprises an amorphous semi-isolating material. The first barrier layer and the second barrier layer partially overlap and form an overlap zone. The overlap zone extends over an entire circumference of the active zone.

In another embodiment, a method of producing a power semiconductor device is provided. The method includes: providing a semiconductor body; providing an active zone in the semiconductor body; providing a peripheral zone in the semiconductor body, the peripheral zone circumferentially surrounding the active zone in a lateral direction; providing a conductive first barrier layer covering the active zone on a front surface of the semiconductor body; providing a metallization layer on the first barrier layer; and providing a second barrier layer covering at least a part of the peripheral zone, the second barrier layer comprising amorphous semi-isolating material. The first barrier layer and the second barrier layer partially overlap and form an overlap zone. The overlap zone extends over an entire circumference of the active zone.

These and other embodiments are illustrated in the attached drawings and described in detail below. Accordingly, those skilled in the art will recognize additional features and advantages of the present invention upon reading the following detailed description and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
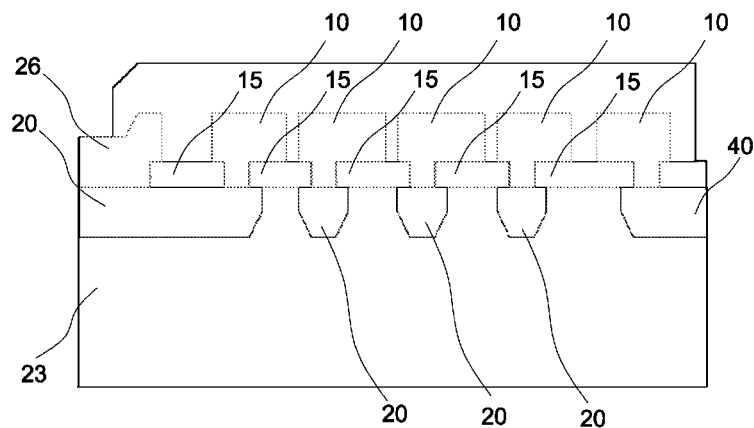
FIG. 1 schematically illustrates a semiconductor device according to the prior art.

In the following Detailed Description, reference is made to the accompanying drawings, which form a part hereof, and in which are shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" or "lateral" as used in this specification intends to describe an orientation substantially parallel to a first or main horizontal surface of a semiconductor substrate or body. This can be, for instance, the surface of a wafer or a die.

The term "vertical" as used in this specification is intended to describe an orientation which is substantially arranged perpendicular to the first surface, i.e., parallel to a normal direction with respect to a lateral surface of a semiconductor substrate or body.

Further, the terms "active zone" and "active region" of a semiconductor device are used interchangeably herein, as well as "passive zone", "passive region", "peripheral zone", "termination region" and "edge termination region".

Further, the term "semi-isolating" as used herein is intended to describe a property of a material which is characterized by a specific electrical resistance of $10^6$ Ωcm or greater, more preferred $10^8$ Ωcm or greater, even more preferred $10^{10}$ Ωcm or greater.

Further, the terms "peripheral zone" and "termination zone" are used interchangeably.

In this specification, an n-doped material or region is referred to as having a first conductivity type, while a p-doped material or region is referred to as having a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration that is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$ regions can have different absolute doping concentrations. The same applies, for example, to an $n^+$ and a $p^+$ region.

Embodiments described in this specification may pertain to, without being limited thereto, field effect transistors, and in particular pertain to power field effect transistors. The term "field-effect," as used in this specification, is intended to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in ohmic contact with a drain or collector electrode. The source region or emitter region is in ohmic contact with a source or emitter electrode. Without applying an external voltage between the gate electrode and the source or emitter electrode, the ohmic current path between the source or emitter electrode and the drain or collector electrode through the semiconductor device is broken or at least high-ohmic in normally-off field effect devices. In normally-on field effect devices such as HEMTs (High Electron Mobility Transistors), depletion MOSFETs (Metal Oxide Field Effect Transistors) and normally-on JFETs (Junction-FETs), the current path between the source electrode and the drain electrode through the semiconductor device is typically low-ohmic without applying an external voltage between the gate electrode and the source or emitter electrode.

In the context of the present specification, the term "field-effect structure" is intended to describe a structure formed in a semiconductor substrate or semiconductor device having a gate electrode for forming and or shaping a conductive channel in the channel region. The gate electrode is at least insulated from the channel region by a dielectric region or dielectric layer.

The terms "depleted" and "completely depleted" are intended to describe that a semiconductor region comprises substantially no free charge carriers. Typically, insulated field-plates are arranged close to pn-junctions formed, e.g., between a drift region and a body region. Accordingly, the blocking voltage of the pn-junction and the semiconductor device, respectively, may be increased. The dielectric layer or region that insulates the field-plate from the drift region is in the following also referred to a field dielectric layer or field dielectric region. The gate electrode and the field-plate may be on same electrical potential or on different electrical potential. The field-plate may be on source or emitter potential. Furthermore, a portion of the gate electrode may be operated as field electrode.

Examples of dielectric materials for forming a dielectric region or dielectric layer between the gate electrode or a field-plate and the drift region include, without being limited thereto, $SiO_2$, $Si_3N_4$, $SiO_xN_y$, $Al_2O_3$, $ZrO_2$, $Ta_2O_5$, $TiO_2$ and $HfO_2$, as well as mixtures and/or layers or liners of these materials.

Embodiments described herein generally have the aim of reducing the described inherent disadvantages of a Cu metallization on a (non-limiting) semiconductor comprising Si, by employing an additional continuous barrier in the active area of the chip, as well as in the region of an edge termination. To this end, it is proposed to provide an additional, homogeneous semi-isolating layer, for example of amorphous carbon, in the region of the edge termination, the semi-isolating layer, henceforth also called second barrier layer, partly overlapping with the high melting metal barrier—henceforth also called first barrier layer—which is in a non-limiting example TiW, in the active region. In the case of the non-limiting example carbon, the semi-isolating layer or second barrier layer is thereby preferably deposited in a manner which ensures a high percentage of $sp^3$-bonds in the deposited carbon material. Because of its diamond-like properties, this material is also called diamond-like carbon or DLC. Such layers can, for example, be deposited by plasma enhanced chemical vapor deposition (PECVD). By combining the conducting barrier layer or first barrier layer in the active area or contact area with a semi-isolating layer in an edge termination region or peripheral region, a barrier against Cu diffusion is achieved which is effective in all areas of the device. Both first and second barrier layers have to be designed and deposited such that there is no remaining diffusion channel for Cu ions between them, which in embodiments is achieved by providing a lateral overlap between the conducting first barrier layer and the semi-isolating layer (second barrier layer). In a non-limiting example with a thickness of the TiW first barrier layer and the semi-isolating second barrier layer having a thickness of about 300 nm each, a lateral overlap between both first and second barrier layers of 1 to 10 µm is typically sufficient, while it may also be greater or smaller, e.g. from 0.5 µm to about 100 µm. Thereby, the semi-isolating second barrier layer typically circumferentially surrounds the conducting high-melting metal first barrier layer, for example TiW, laterally.

Generally, the semi-isolating layer, also called second barrier layer, of all embodiments described herein comprises amorphous material with a suitable density of electronic states in the pseudo gap due to the lack of a crystal lattice structure. In particular, electronic states in the vicinity of the Fermi level may be recharged by the field effect and can thus actively contribute to a buildup of charges. Typical suitable materials for the semi-isolating layer in embodiments are amorphous materials such as amorphous Silicon (aSi), semi-isolating Poly-Silicon (SIPOS), Diamond-Like Carbon (DLC) or amorphous Silicon Carbide ($aSi_{1-x}C_x$). Such layers may be deposited for example by using evaporation deposition or Chemical Vapor Deposition (CVD). The second barrier layer (semi-isolating barrier layer) is typically provided by PECVD. Thereby, a precursor gas for the PECVD process comprises typically at least one of saturated hydrocarbons, and unsaturated hydrocarbons. In the process, aliphatic hydrocarbons, cyclic hydrocarbons, and aromatic hydrocarbons may be employed, or mixtures thereof. Typically, the precursor gas for the PECVD also comprises a dopant. Those dopants employed in embodiments may be $SiH_4$, $NH_3$, $B_2H_6$, and $PH_3$. They may be used to modify the properties of the second barrier layer (semi-isolating barrier layer).

In embodiments, plasma enhanced chemical vapour deposition (PECVD or plasma enhanced CVD) may be used to deposit Si-doped DLC-layers from precursor gases such as (non-limiting) silane or methane, because with these precursors a very high density of states may be adjusted. Via these energetically low states, the required counter-charges to the accumulation layer and the inversion layer can be gained. Because of their chemical composition, up to 60% hydrogen is included in the materials, which leads to a good saturation of dangling bonds. By adjusting the relative gas flows of, for example, methane and silane, the parameter x in a a $Si_{1-x}C_x$:H layer may be adjusted freely. In embodiments, other semi-isolating layers are hydrogen-free DLC layers, which may for example be deposited by laser ablation, cathodic arc evaporation, sputtering or ion beam coating from a solid source like graphite. Such layers are frequently named as taC layers and show, similar to the hydrogen containing DLC layers, a diamond-like amorphous structure with embedded graphite clusters.

While embodiments described herein are mainly related to Si based semiconductors, in embodiments also other semiconductor materials, such as SiC, GaN, or GaAs may be applied.

While in the embodiments described, the semiconductor device 100 is a diode, the device may in embodiments be any semiconductor device having a pn junction in the vicinity of a surface. In particular, it may be a IGBT, a FET, a thyristor, a GTO, a JFET, a MOSFET, a compensation MOSFET, a BJT, a diode, and a HEMT.

Figure 2:
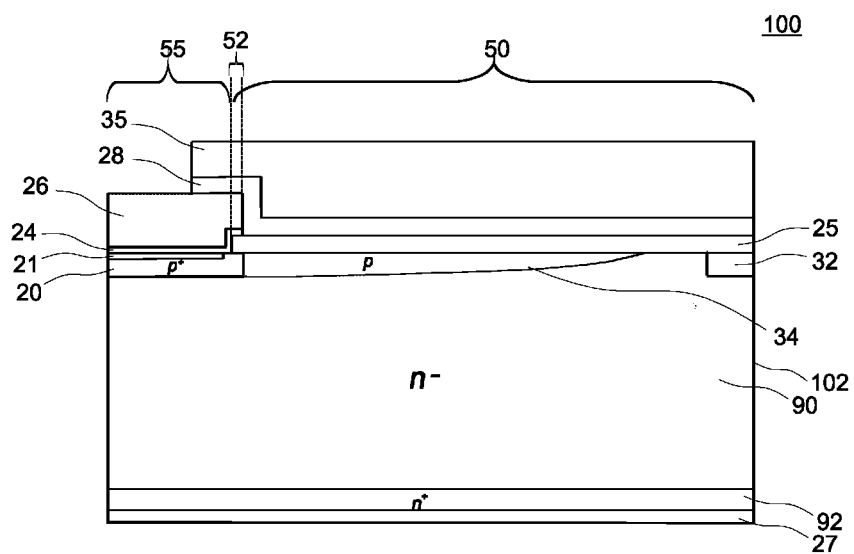
FIG. 2 schematically illustrates a vertical cross-section of a semiconductor device according to one or more embodiments.

FIG. 2 shows a semiconductor device 100 according to embodiments, where the edge termination region or high voltage peripheral zone 50 has a so-called VLD structure (VLD=Variation of Lateral Doping). Such a high voltage peripheral zone 50 has a region 34 that is doped more weakly than the laterally adjacent well 20, and whose doping decreases in the lateral direction of the semiconductor body 90 in the direction of the edge 102. In this case, the doping of the zone 34 may merge continuously or discontinuously with the doping of the heavily doped well 20. In order to limit the space charge zone at the outermost semiconductor edge 102 in the case of a reverse-biased pn junction, a channel stopper 32 may be provided in embodiments. The semiconductor body 90 of the semiconductor device 100 has an active zone 55, and a high voltage peripheral zone 50 laterally adjacent to each other. Thereby, the high voltage peripheral zone 50 laterally surrounds the active zone 55. The active zone 55 is terminated on its front surface by a first barrier layer 24, which is connected to the active zone 55, in particular to the well 20. Optionally, in embodiments there may be a contact pad 21 provided between the well 20 and the first barrier layer 24. The first barrier layer 24 comprises a high-melting metal or a high-melting alloy and is located between the active zone 55 and a metallization layer 26. The first barrier layer 24 inhibits unwanted reactions of the Cu of the metallization 26 with the semiconductor material below the metallization 26, in particular well 20, as was described in detail further above. On a backside of the semiconductor device 100, a higher doped contact zone 92 provides electrical contact to backside metallization 27. A second barrier layer 25, comprising a semi-isolating amorphous material as described above, is located between the body 90 of the semiconductor device 100, in particular abutting zone 34. In a non-limiting example, the second barrier layer 25 comprises diamond-like carbon and covers a front surface of at least a part of the high voltage peripheral zone 50. According to embodiments, the first barrier layer 24 and the second barrier layer 25 partially overlap and thus form an overlap zone 52. The overlap zone 52 extends over an entire circumference of the active zone 55. Thereby, the overlap zone 52 has a width of about 0.5 μm to about 100 μm, more preferably from about 5 μm to about 20 μm.

Embodiments described herein are particularly advantageous when applied to a semiconductor device having a zone with a variable lateral doping, such as shown in FIGS. 2 to 5. This is because the shielding effect of the second barrier layer 25, namely in the case of DLC, can also be used for ensuring a long term stability of the barrier. Further, high steps in the topology of the high voltage peripheral region can be avoided, which are undesirable in terms of a field distribution, and which may also be weaknesses due to mechanical stress and humidity. To further improve long term stability and endurance, additional layers may be added on top of the second barrier layer 25. This is the case in FIG. 2, where a first additional passivation layer 28 of, e.g., $Si_3N_4$ is provided. This layer or these layers are typically chosen to form an optimal protection together with the second barrier layer 25 in terms of mechanical stress, electrochemical resistivity and resistivity against humidity.

Figure 3:
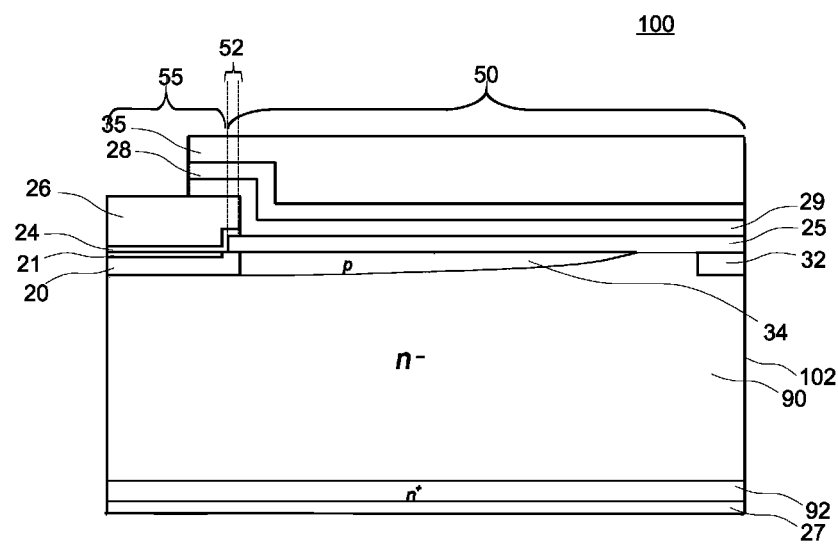
FIG. 3 schematically illustrates a vertical cross-section of a semiconductor device according to one or more embodiments.

FIG. 3 shows an embodiment based on that of FIG. 2, but comprising a first additional layer 29 of $SiO_2$ provided between the second barrier layer 25 and the additional passivation layer 28 of, e.g., $Si_3N_4$.

Figure 4:
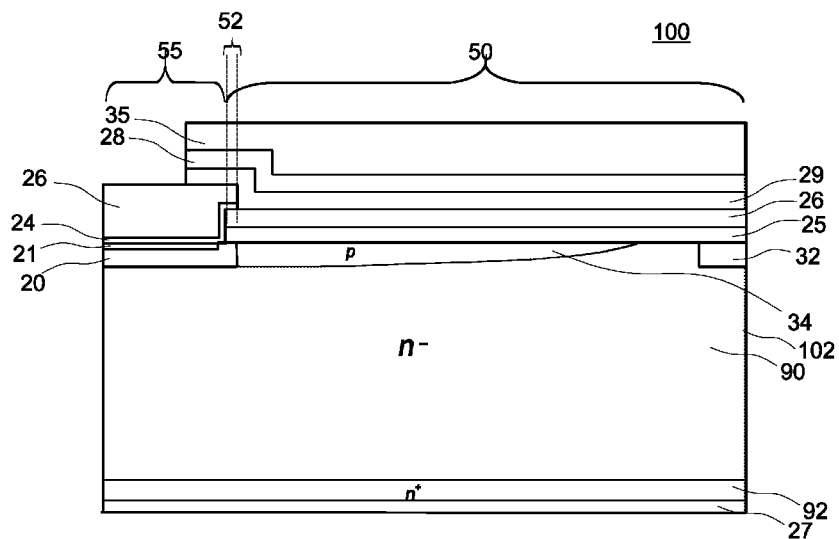
FIG. 4 schematically illustrates a vertical cross-section of a semiconductor device according to one or more embodiments.

Based on the embodiment of FIG. 3, in FIG. 4 the semiconductor device 100 further comprises a second additional passivation layer 28 of, e.g., $Si_3N_4$ between the second barrier layer 25 and the first additional layer 29 of $SiO_2$. Thereby, the latter is provided to also, together with the second barrier layer 25, being overlapped by the first barrier layer 24. Thus, the inhibition of Cu diffusion through the overlapping zone 52 is further reduced.

Figure 5:
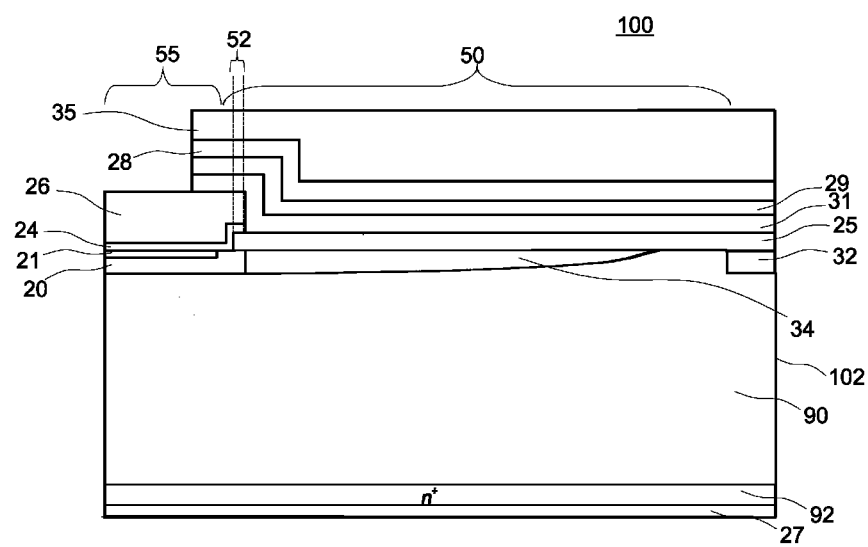
FIG. 5 schematically illustrates a vertical cross-section of a semiconductor device according to one or more embodiments.

The embodiment shown in FIG. 5 is based on the embodiment of FIG. 4, however the second additional passivation layer 31 of, e.g., $Si_3N_4$, is provided differently. It also overlaps the Cu metallization 26 together with the first additional layer 29 of $SiO_2$ and the additional passivation layer 28 of, e.g., $Si_3N_4$.

Figure 6:
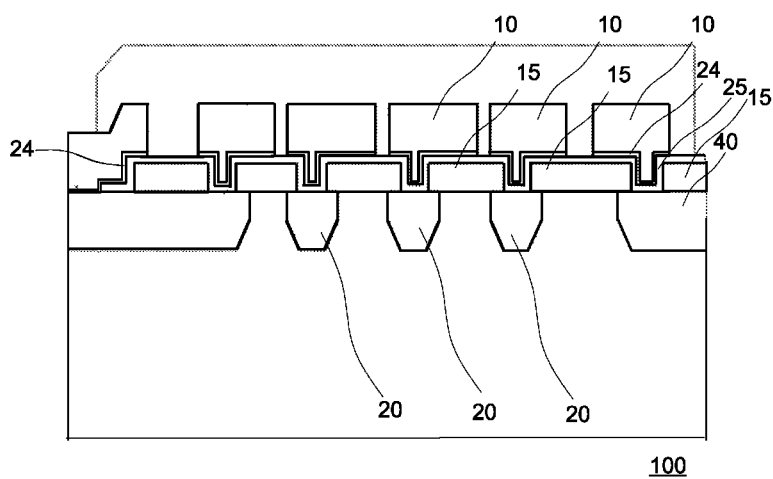
FIG. 6 schematically illustrates a vertical cross-section of a semiconductor device according to one or more embodiments.
Figure 7:
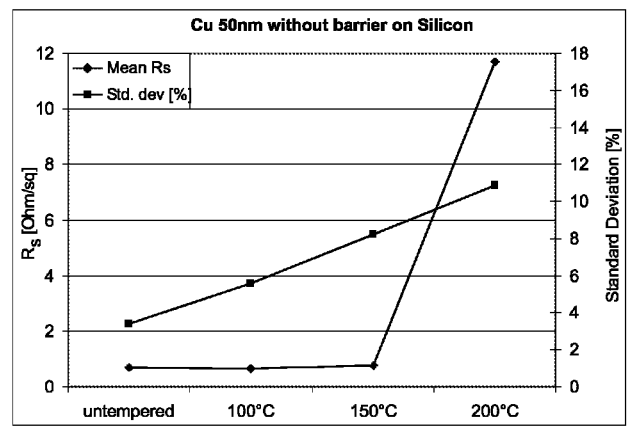
FIGS. 7 to 10 show measurement results of a resistance over a temperature range for various second barrier layers.
Figure 8:
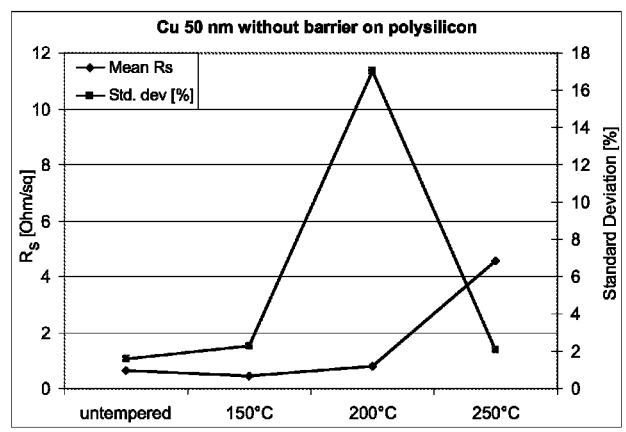
Figure 9:
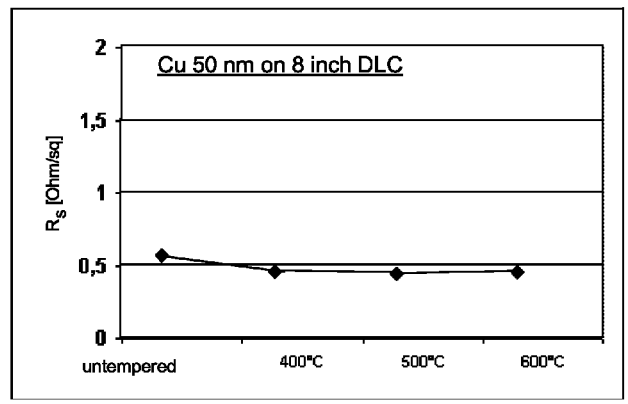
Figure 10:
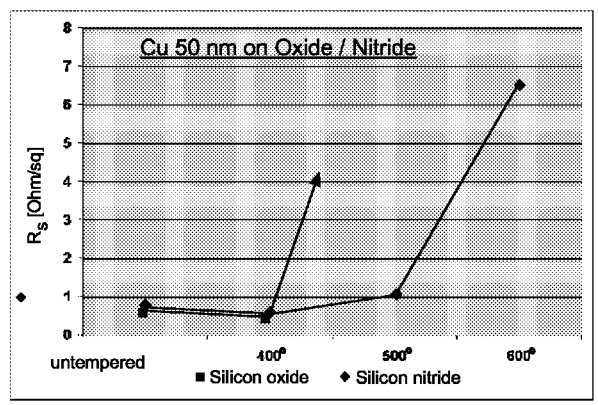

FIG. 6 illustrates a vertical cross-section of a semiconductor device having a construction similar to what is shown in FIG. 4, but different in at least with the addition of the first and second barrier layers 24, 25.

The barrier effect of various layer materials used in an edge termination in embodiments has been tested by the inventors, namely polysilicon, $SiO_2$, $Si_3N_4$ and diamond-like carbon. The materials were deposited using PECVD (in case of Poly-Si LPCVD) on a silicon wafer on a bigger surface. Thereon, a 50 nm Cu layer was deposited and the resistance of the assembly was measured using 4-point-measuring. Thereafter, the wafers were heated successively and the resistance was measured again. The results are shown in FIGS. 7 to 10. The best result was yielded by diamond-like carbon, with a constant resistance up to a temperature of 600° C.

Figure 11:
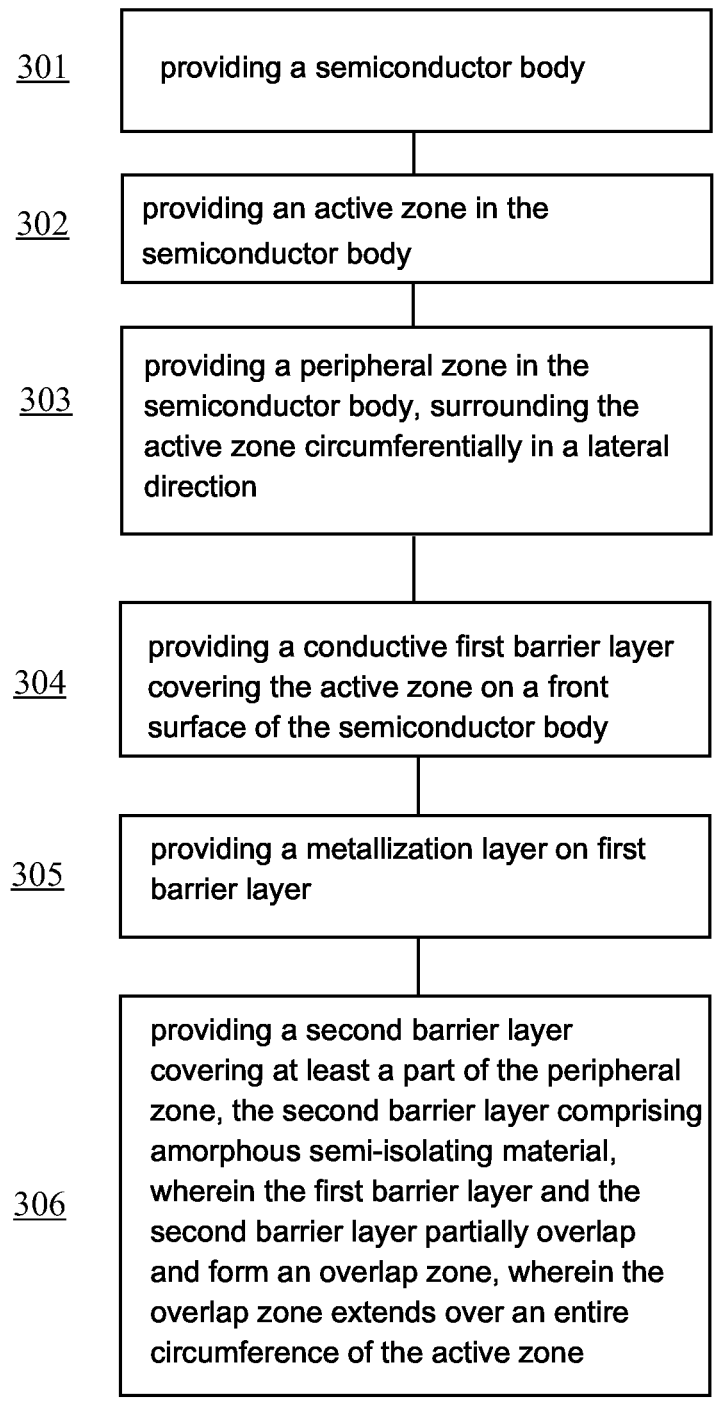
FIG. 11 schematically shows a method for producing a semiconductor device according to embodiments.

In FIG. 11 a diagram of a method 300 for producing a power semiconductor device according to embodiments is shown. The method 300 includes providing a semiconductor body (Block 301), providing an active zone in the semiconductor body (Block 302), providing a peripheral zone in the semiconductor body the peripheral zone circumferentially surrounding the active zone in a lateral direction (Block 303), providing a conductive first barrier layer covering the active zone on a front surface of the semiconductor body (Block 304), providing a metallization layer on first barrier layer (Block 305), providing a second barrier layer covering at least a part of the peripheral zone, the second barrier layer comprising amorphous semi-isolating material, wherein the first barrier layer and the second barrier layer partially overlap and form an overlap zone, wherein the overlap zone extends over an entire circumference of the active zone (Block 306).

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power semiconductor device, comprising:
a semiconductor body, having an active zone and a high voltage peripheral zone laterally adjacent to each other, the high voltage peripheral zone laterally surrounding the active zone;
a metallization layer on a front surface of the semiconductor body and connected to the active zone;
a first barrier layer, comprising a high-melting metal or a high-melting alloy, between the active zone and the metallization layer; and
a second barrier layer covering at least a part of the peripheral zone, the second barrier layer comprising an amorphous semi-isolating material,
wherein the first barrier layer and the second barrier layer partially overlap and form an overlap zone, the overlap zone extending over an entire circumference of the active zone.

2. The power semiconductor device of claim 1, wherein the overlap zone has a width of about 0.5 μm to about 100 μm.

3. The power semiconductor device of claim 1, wherein the second barrier layer comprises at least one of amorphous silicon, semi-isolating poly-silicon, diamond-like carbon, and amorphous silicon carbide.

4. The power semiconductor device of claim 1, wherein the overlap zone is located in a transition region between the active zone and the high voltage peripheral zone.

5. The power semiconductor device of claim 1, wherein the first barrier layer comprises W, Ta, Ti, Mo, or alloys of at least one of W, Ta, Ti, and Mo.

6. The power semiconductor device of claim 1, wherein the first barrier layer and the second barrier layer each have a thickness from about 100 nm to about 400 nm.

7. The power semiconductor device of claim 1, wherein the metallization layer comprises copper.

8. The power semiconductor device of claim 1, wherein the peripheral zone has a varying lateral doping.

9. The power semiconductor device of claim 1, wherein the semiconductor device is one of an IGBT, a FET, a diode, a thyristor, a GTO, a JFET, a MOSFET, a compensation MOSFET, a BJT, and a HEMT.

10. The power semiconductor device of claim 1, wherein the semiconductor body comprises one of Si, SiC, GaN, and GaAs.

11. A method of producing a power semiconductor device, comprising:
providing a semiconductor body;
providing an active zone in the semiconductor body;
providing a peripheral zone in the semiconductor body, the peripheral zone circumferentially surrounding the active zone in a lateral direction;
providing a conductive first barrier layer covering the active zone on a front surface of the semiconductor body;
providing a metallization layer on first barrier layer; and
providing a second barrier layer covering at least a part of the peripheral zone, the second barrier layer comprising amorphous semi-isolating material, wherein the first barrier layer and the second barrier layer partially overlap and form an overlap zone, the overlap zone extending over an entire circumference of the active zone.

12. The method of claim 11, wherein the overlap zone has a width of about 0.5 µm to about 100 µm.

13. The method of claim 11, wherein the second barrier layer comprises at least one of amorphous silicon, semi-isolating poly-silicon, diamond-like carbon, and amorphous silicon carbide.

14. The method of claim 11, wherein the second barrier layer is provided by PECVD.

15. The method of claim 14, wherein a precursor gas for the PECVD comprises at least one of saturated hydrocarbons and unsaturated hydrocarbons.

16. The method of claim 14, wherein a precursor gas for the PECVD comprises at least one of an aliphatic hydrocarbon, a cyclic hydrocarbon, and an aromatic hydrocarbon.

17. The method of claim 14, wherein a precursor gas for the PECVD comprises a dopant.

18. The method of claim 14, wherein a precursor gas for the PECVD comprises at least one of $SiH_4$, $NH_3$, $B_2H_6$, $PH_3$, to modify the properties of the second barrier layer.

19. The method of claim 11, wherein the overlap zone is located in a transition region between the active zone and the peripheral zone.

20. The method of claim 11, wherein the first barrier layer comprises TiW.

21. The method of claim 11, wherein the first barrier layer and the second barrier layer each have a thickness from about 100 nm to about 400 nm.

22. The method of claim 11, wherein the metallization layer comprises copper.

23. The method of claim 11, wherein the peripheral zone has a varying lateral doping.

24. The method of claim 11, wherein the semiconductor device is one of an IGBT, a FET, a diode, a thyristor, a GTO, a JFET, a MOSFET, a compensation MOSFET, a BJT, and a HEMT.

25. The method of claim 11, wherein the semiconductor body comprises Si, SiC, GaN, or GaAs.

* * * * *